United States Patent
Nishimura et al.

(10) Patent No.: US 6,286,525 B1
(45) Date of Patent: Sep. 11, 2001

(54) SUBSTRATE CLEANING APPARATUS AND METHOD

(75) Inventors: Joichi Nishimura; Akihiko Morita; Masami Ohtani, all of Kyoto (JP)

(73) Assignee: Dainippon Screen Mfg. Co. (JP)

( * ) Notice: Subject to any disclaimer, the term of this patent is extended or adjusted under 35 U.S.C. 154(b) by 0 days.

(21) Appl. No.: 09/071,683

(22) Filed: May 1, 1998

(30) Foreign Application Priority Data

May 8, 1997 (JP) .................................................... 9-117809

(51) Int. Cl.[7] ................................. B08B 3/00; B08B 1/00
(52) U.S. Cl. ........................ 134/95.3; 134/153; 134/902; 15/88.2; 15/102
(58) Field of Search ............................ 134/1.2, 34, 95.3, 134/153, 902; 438/748, 753, 745, 752, 754; 15/88.2, 88.3, 88.4, 102

(56) References Cited

U.S. PATENT DOCUMENTS

| | | | |
|---|---|---|---|
| 5,361,449 | * 11/1994 | Akimoto et al. | 118/52 |
| 5,518,542 | * 5/1996 | Matsukawa et al. | 118/52 |
| 5,651,160 | * 7/1997 | Yonemizu et al. | 15/302 |
| 5,868,854 | * 2/1999 | Kojima et al. | 134/1.3 |
| 5,868,866 | * 2/1999 | Maekawa et al. | 134/34 |
| 5,893,381 | * 4/1999 | Terui | 134/6 |
| 5,893,756 | * 4/1999 | Berman et al. | 438/692 |

FOREIGN PATENT DOCUMENTS

| | | | |
|---|---|---|---|
| 06120192 | * 4/1994 | (JP) | H01L/21/304 |
| 10294261 | * 11/1998 | (JP) | B05C/11/08 |
| 11003846 | * 1/1999 | (JP) | B05C/11/08 |

* cited by examiner

*Primary Examiner*—Benjamin L. Utech
*Assistant Examiner*—Matthew Anderson
(74) *Attorney, Agent, or Firm*—Ostrolenk, Faber, Gerb & Soffen, LLP

(57) ABSTRACT

A plurality of cleaning devices of the same type are attached to one support arm. The cleaning devices are simultaneously moved over a surface to be cleaned of a substrate supported and spun by a substrate supporting and spinning mechanism. Thus, the same type of cleaning devices share the task of cleaning the entire surface of the substrate, thereby to improve cleaning efficiency and shorten cleaning time. Different types of cleaning devices may be attached to the support arm for simultaneous cleaning of the entire surface of the substrate. Where different types of cleaning brushes are attached to the support arm, a cleaning operation may be carried out by simultaneously using cleaning brushes of optimal hardness for different regions on the substrate surface.

8 Claims, 13 Drawing Sheets

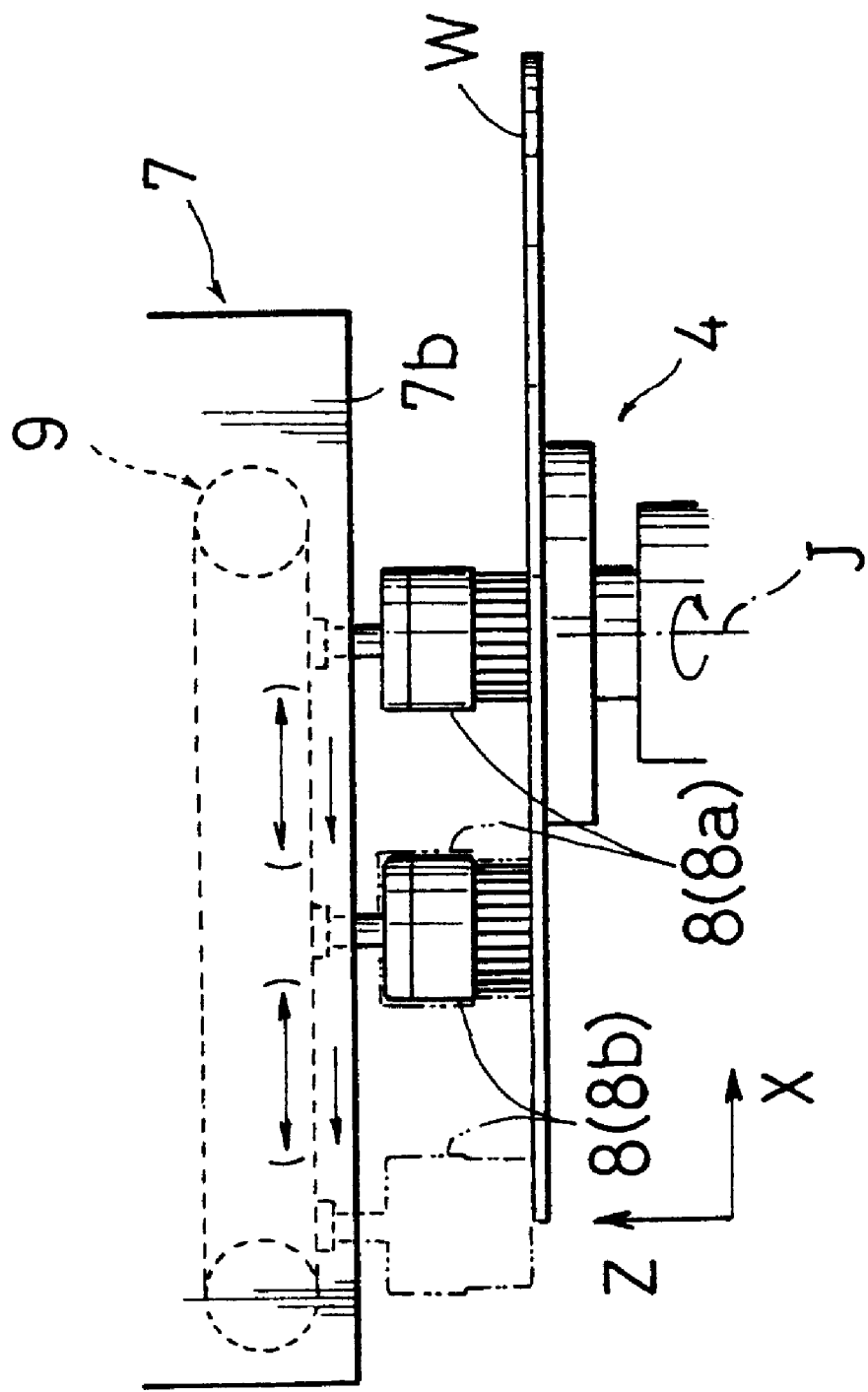

SUBSTRATE CLEANING APPARATUS AND METHOD

BACKGROUND OF THE INVENTION (1). Field of the Invention

The present invention relates to substrate cleaning apparatus and substrate cleaning methods for cleaning surfaces of substrates such as semiconductor wafers, glass substrates for liquid crystal displays, glass substrates for photomasks and substrates for optical disks. In particular, a surface of such a substrate is cleaned while the substrate is spun, with cleaning devices such as cleaning brushes, high-pressure cleaning nozzles or ultrasonic cleaning nozzles.

(2). Description of the Related Art

A conventional substrate cleaning apparatus of this type, generally, includes one cleaning device supported by one support arm. The one cleaning device supported by the support arm is moved over a surface of a spinning substrate between the spin center and the outer periphery of the substrate to clean the entire surface of the substrate.

Where various cleaning devices such as a cleaning brush, a high-pressure cleaning nozzle and an ultrasonic cleaning nozzle are provided, each cleaning device is supported by a separate support arm. Each support arm (or cleaning device) is separately driven by an individual drive mechanism. A selected one of the cleaning devices is moved over a surface of a spinning substrate between the spin center and the outer periphery of the substrate to clean the entire surface of the substrate.

Conventional apparatus with such constructions have the following drawbacks.

Substrate size has been increasing in recent years, and in the case of semiconductor wafers, for example, 8-inch wafers are giving way to 300 mm wafers. Substrates have a larger turning radius (length from spin center to outer periphery) than before. Consequently, a longer time is now required for one cleaning device to move from the spin center to the outer periphery of a substrate. An extended cleaning time is becoming a matter of concern.

The spin velocity of a substrate is progressively higher toward the outer periphery thereof. When, for example, an entire surface of a substrate is cleaned with the same type of cleaning brushes and with the same conditions, regions adjacent the spin center of the substrate are vulnerable to damage, while peripheral regions may be cleaned insufficiently. Such a tendency is all the more outstanding with large substrates. Thus, in cleaning a surface of a large substrate with cleaning brushes, there has been a desire to clean central regions of the substrate with a soft cleaning brush such as a mohair brush in order to avoid damage, and peripheral regions with a hard cleaning brush such as a PVA brush in order to obtain an excellent cleaning result. Such a requirement may be satisfied with a conventional apparatus only by following a troublesome procedure. That is, the soft cleaning brush is attached to the support arm first to clean central regions of a large substrate. When the central regions have been cleaned, the support arm is moved to a retracted position once, and the soft brush is replaced with the hard one. Subsequently, peripheral regions of the large substrate are cleaned with the hard cleaning brush. This procedure poses a problem of low cleaning efficiency and extended cleaning time.

Where a cleaning process is performed by using various cleaning devices, a conventional apparatus cannot clean a surface of a substrate with the various cleaning devices at a time since the support arms supporting the respective cleaning devices would interfere with one another. Thus, the cleaning devices must be selected successively and driven individually for use. While one cleaning device is engaged in a cleaning operation, the other cleaning devices are kept on standby in retracted positions. All this results in low cleaning efficiency and extended cleaning time.

Moreover, the conventional apparatus has a complicated construction and is costly since a plurality of drive mechanisms are provided for the respective support arms supporting the different cleaning devices.

SUMMARY OF THE INVENTION

The present invention has been made having regard to the state of the art noted above, and its object is to provide a substrate cleaning apparatus of simple construction which promotes cleaning efficiency and achieves a reduced cleaning time.

The above object is fulfilled, according to the present invention, by an apparatus for cleaning a surface of a substrate, comprising:

a substrate supporting device for supporting the substrate;

a substrate spinning device for spinning the substrate supported by the substrate supporting device;

a cleaning device for cleaning the surface of the substrate;

a support arm for supporting the cleaning device; and a support arm displacing device for displacing the support arm to move the cleaning device supported by the support arm between a cleaning position and a retracted position;

wherein the support arm supports the cleaning device including a plurality of cleaning devices, the support arm displacing device displacing the support arm to move simultaneously the cleaning devices supported by the support arm between the cleaning position and the retracted position;

the apparatus further comprising a cleaning displacement device for simultaneously moving the cleaning devices supported by the support arm, over the surface of the substrate supported by the substrate supporting device and spun by the substrate spinning device.

In another aspect of the invention, there is provided a method of cleaning a surface of a substrate, comprising the steps of:

placing the substrate in position;

moving a plurality of cleaning devices supported by a support arm from a retracted position to a cleaning position;

spinning the substrate; and cleaning the surface of the substrate by simultaneously moving the cleaning devices supported by the support arm, over the surface of the substrate in a spin.

According to the above substrate cleaning apparatus and method, a plurality of cleaning devices supported by one support arm are simultaneously moved over a surface to be cleaned of a substrate supported and spun. In this way, the surface of the substrate is cleaned simultaneously by the plurality of cleaning devices to improve cleaning efficiency and shorten cleaning time even for large substrates. Further, compared with a conventional apparatus having a plurality of drive mechanisms for driving a plurality of support arms, respectively, the apparatus according to the present invention can move the plurality of cleaning devices with a reduced number of drive mechanisms. This provides a simplified construction and a cost reduction.

Where the cleaning devices supported by the support arm include one type of cleaning devices, these cleaning devices may share the task of cleaning the surface of the substrate to be cleaned. This feature improves cleaning efficiency and shortens cleaning time even for large substrates.

Where the cleaning devices supported by the support arm include different types of cleaning devices, these cleaning devices may be operated simultaneously to clean the surface of the substrate to be cleaned. The different types of cleaning devices may clean the substrate efficiently to shorten cleaning time.

Where the cleaning devices supported by the support arm include different types of cleaning devices, the cleaning devices may be adapted switchable, separately by type, between a cleaning state and an inoperative state. This construction allows a selection between simultaneous cleaning with the plural types of cleaning devices and separate cleaning with each type of cleaning device. A change from one type of cleaning device to another type for use in cleaning treatment may be made simply by switching each type of cleaning device between cleaning state and inoperative state. Thus, such change may be effected speedily.

Where the cleaning devices supported by the support arm include different types of cleaning devices, the support arm may support a plurality of each different type cleaning devices. Then, the different types of cleaning devices supported by the support arm may be simultaneously operated to clean the surface of the substrate. It is also possible to operate the plurality of cleaning devices of each type in sharing the task of cleaning the surface of the substrate.

The cleaning devices supported by the support arm may include cleaning brushes, high-pressure cleaning nozzles or ultrasonic cleaning nozzles for cleaning the surface of the substrate.

Where the cleaning devices supported by the support arm include cleaning brushes, the support arm may support a plurality of cleaning brushes including different types of cleaning brushes. Then, varied types of cleaning brushes may be used in cleaning different regions on the substrate surface, thereby to clean the substrate surface efficiently in a reduced time.

An operation by the cleaning displacement device for simultaneously moving the plurality of cleaning devices supported by the support arm, over the surface of the substrate supported by the substrate supporting device and spun by the substrate spinning device, may be effected by a displacement of the support arm by the support arm displacing device. In this case, the support arm displacing device and cleaning displacement device may comprise a common drive mechanism, thereby further reducing the number of drive mechanisms. This feature realizes a further simplification of the construction and a further cost reduction.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 6 is a front view of a modified principal portion of the apparatus in the first embodiment;

DESCRIPTION OF THE PREFERRED EMBODIMENTS

Preferred embodiments of the present invention will be described in detail hereinafter with reference to the drawings.

First Embodiment

Figure 1:
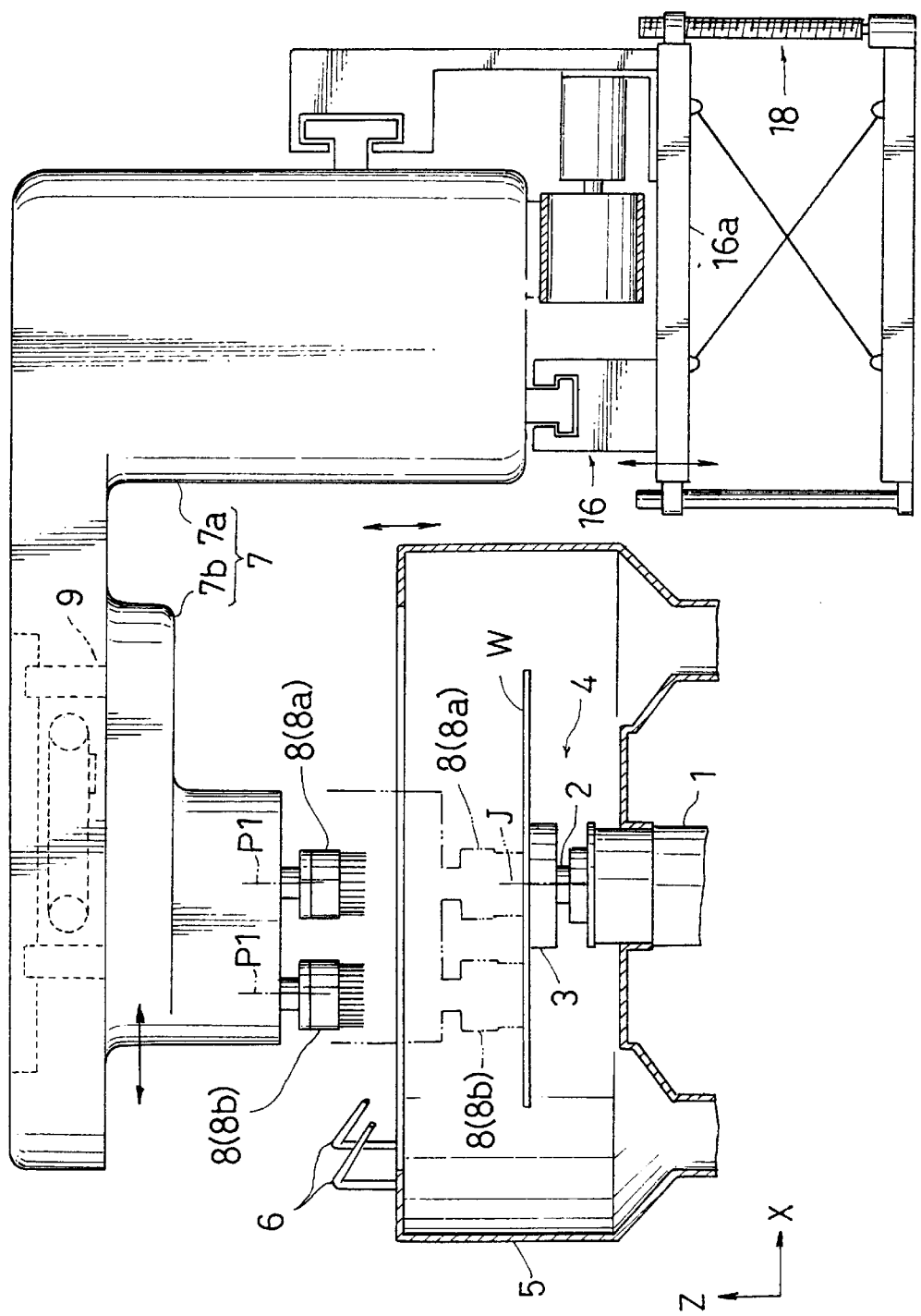
FIG. 1 is an overall front view of a substrate cleaning apparatus in a first embodiment of the present invention.
Figure 2:
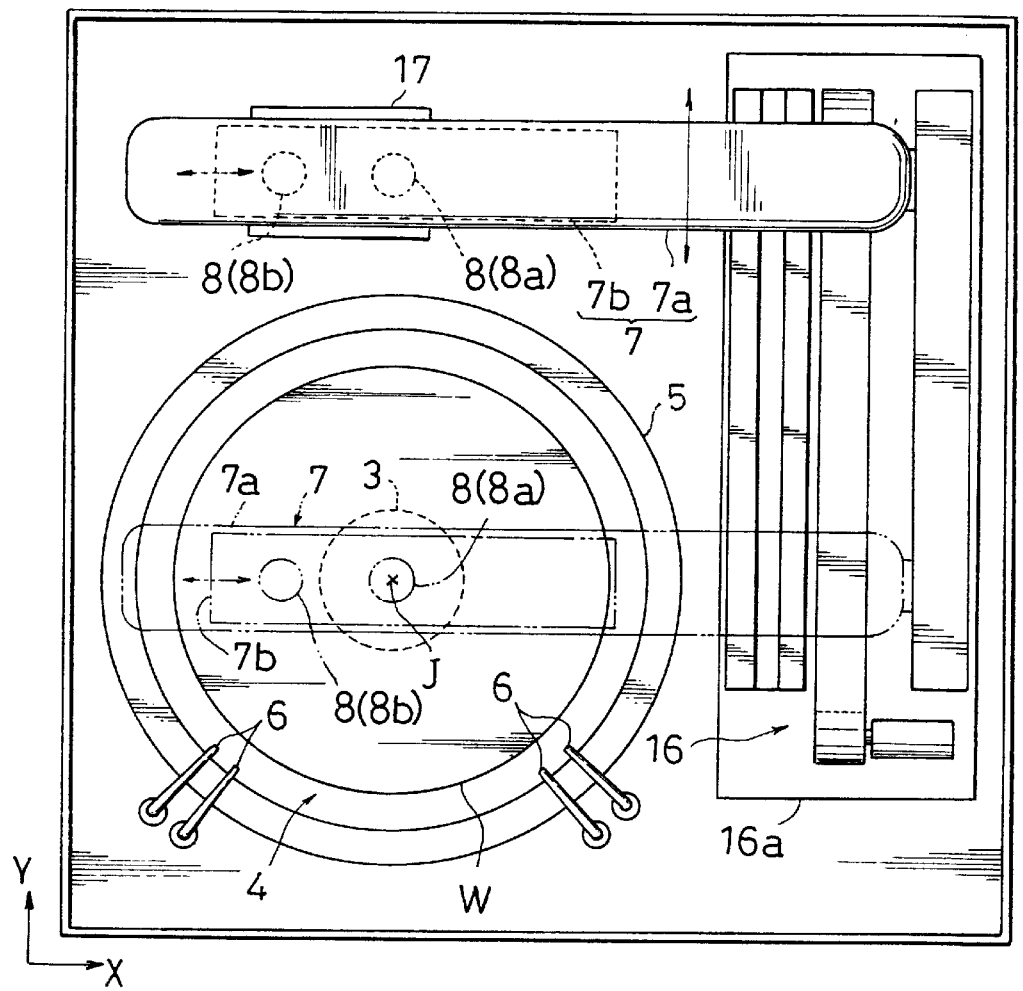
FIG. 2 is a plan view of the apparatus in the first embodiment.

As shown in FIGS. 1 and 2, a spin cleaning apparatus includes an electric motor 1 acting as a substrate spinning device for rotating a rotary shaft 2 about a vertical axis J. A turntable 3 acting as a substrate supporting device is attached to an upper end of the rotary shaft 2 to be rotatable therewith, for supporting a substrate or wafer W by vacuum suction. These components constitute a substrate supporting and spinning mechanism 4 for supporting wafer W and spinning it about the vertical axis J.

Figure 3A:
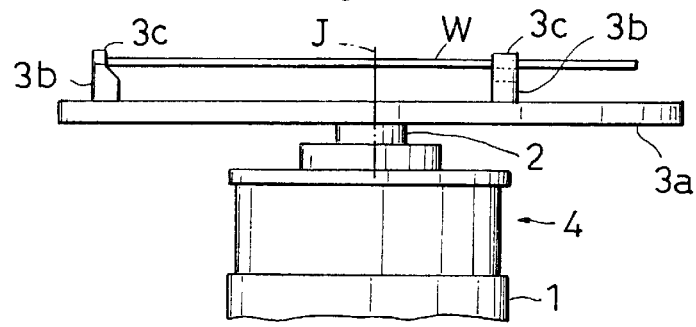
FIG. 3A is a front view of a modified substrate supporting device.
Figure 3B:
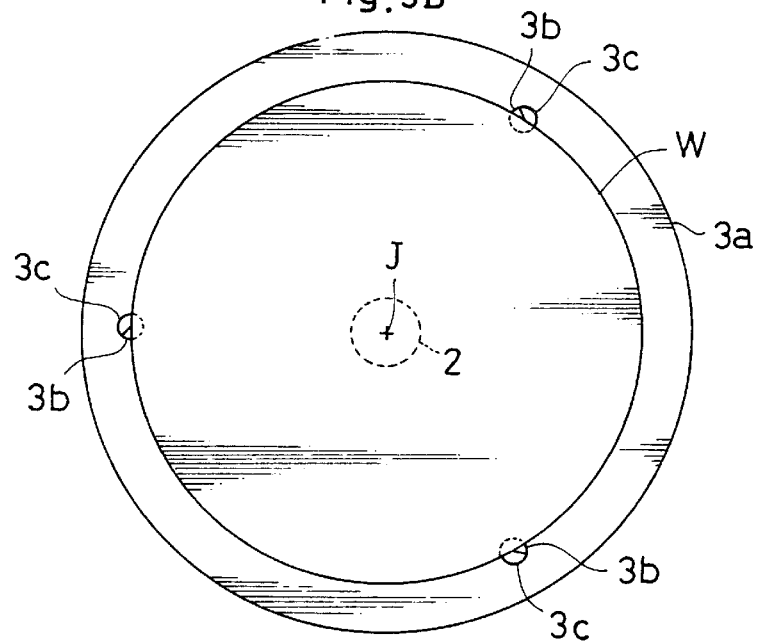
FIG. 3B is a plan view of the modified substrate supporting device shown in FIG. 3A.
Figure 3C:
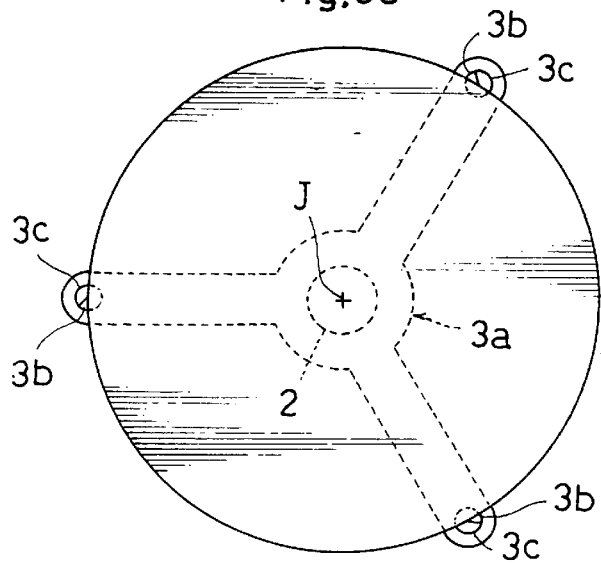
FIG. 3C is a plan view of a modified spin base.

In this embodiment, the substrate supporting device comprises the turntable 3 of the suction-supporting type which, however, is not limitative. For example, as shown in FIGS. 3A and 3B, the substrate supporting device may include a spin base 3a attached to the upper end of the rotary shaft 2 to be rotatable therewith and having three or more substrate supporting elements 3b arranged on the spin base 3a for supporting wafer W from below, with three or more retaining elements 3c for pressing upon outer edges of wafer W supported on the supporting elements 3b. In this case, wafer W is supported for spinning movement in a position spaced from the upper surface of the spin base 3a. The spin base 3a is not limited to a disk shape as seen in plan, but may be star-shaped in plan view as shown in FIG. 3C, for example.

Reverting to FIGS. 1 and 2, the substrate supporting and spinning mechanism 4 and wafer W thereby supported are surrounded by a cup 5 vertically movable by a lift mechanism (not shown). Nozzles 6 are arranged laterally outwardly of the cup 5 for delivering a cleaning liquid such as deionized water toward an upper surface (usually a front surface) of wafer W.

In this embodiment, the cup 5 is vertically movable relative to the substrate supporting and spinning mechanism 4. However, the cup 5 may be fixed, with the substrate supporting and spinning mechanism 4 (or the turntable 3) adapted movable relative to the cup 5.

A support arm 7 is on standby laterally outwardly of the cup 5. The support arm 7 includes a proximal block 7a and a distal block 7b. The distal block 7b has two cleaning brushes 8 (i.e. a first and a second cleaning brushes 8a and 8b) acting as cleaning devices in this embodiment, which are spaced apart in the direction of X in the drawings and rotatable about vertical axes P1, respectively.

The proximal block 7a accommodates a sliding device 9 in the form of a well-known uniaxial drive mechanism such as a belt drive mechanism or a ball screw. The sliding device 9 slides the distal block 7b in the direction of X in the drawings relative to the proximal block 7a, whereby, as described hereinafter, the cleaning brushes 8 are simultaneously moved over the surface of wafer W. The sliding device 9 corresponds to the cleaning displacement device of this invention.

Figure 4:
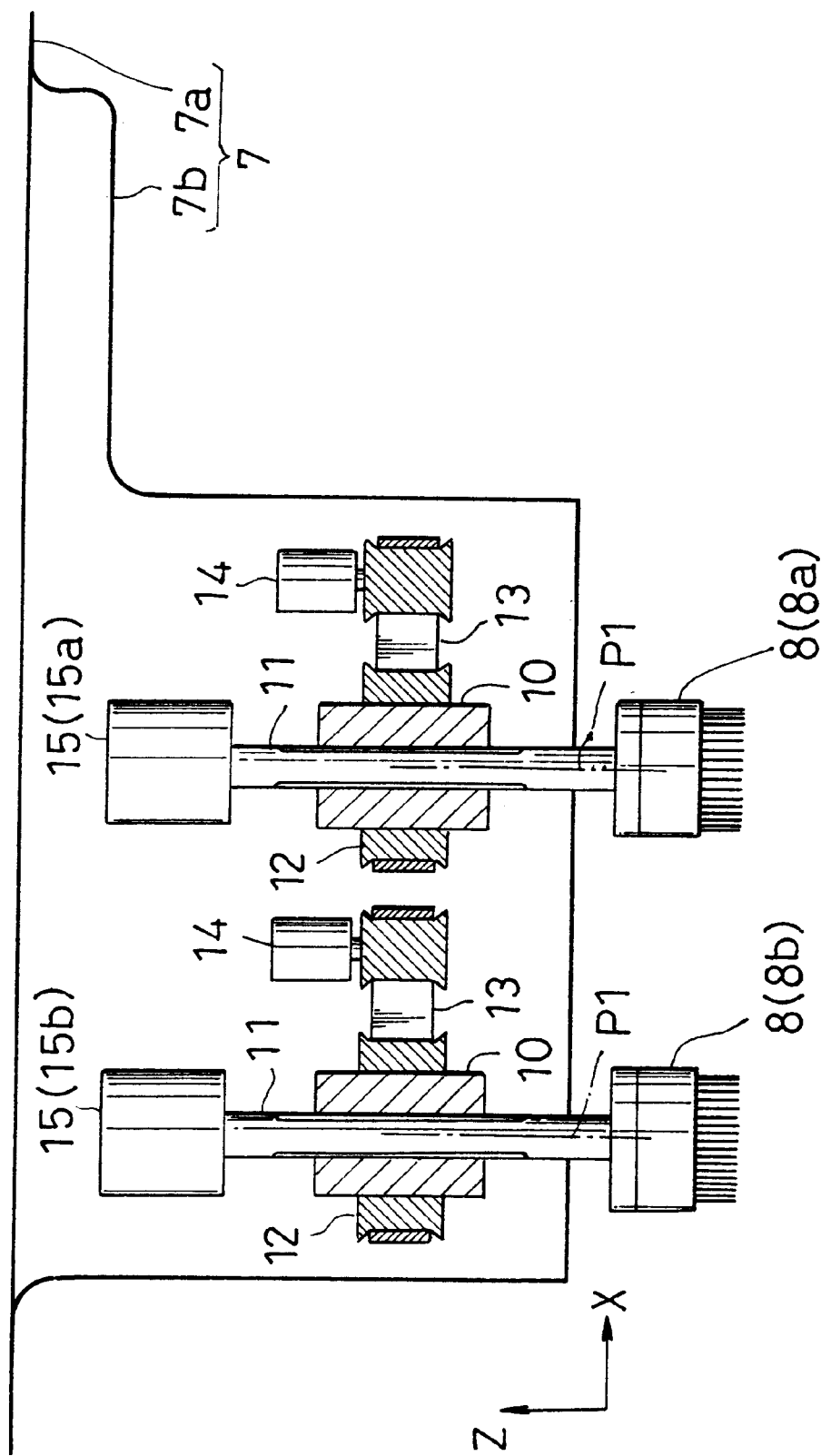
FIG. 4 is an enlarged view of a distal block and adjacent elements in the first embodiment.

As shown in enlargement in FIG. 4, the distal block 7b has two cylindrical rotors 10 supported therein to be rotatable about the axes P1. The rotors 10 are splined to support shafts 11 which are vertically movable relative to the rotors 10 and rotatable with the rotors 10. The cleaning brushes 8 are attached to lower ends of the respective support shafts 11. The rotors 10 have pulleys 12 attached to be rotatable therewith and operatively connected through timing belts 13 to electric motors 14, respectively. Thus, the cleaning brushes 8 (8a and 8b) are individually rotatable about axes P1. The distal block 7b further includes pressing mechanisms 15 (15a and 15b) for raising and lowering the support shafts 11 to vary a pressure applied from the cleaning brushes 8 (8a and 8b) to the wafer W. Each pressing mechanism 15 comprises a well-known mechanism such as an air cylinder, a linear actuator or a mechanism using a weight.

Reverting to FIGS. 1 and 2, the entire support arm 7 is movable in the direction of Y in the drawings by a Y-direction moving device 16 in the form of a well-known uniaxial drive mechanism such as a belt drive mechanism or a ball screw. Thus, the two cleaning brushes 8 are simultaneously movable between a cleaning position on the wafer W and a retracted position laterally outwardly of the cup 5. In the retracted position, the cleaning brushes 8 stand by in a standby pot 17 to be cleaned therein.

The Y-direction moving device 16 has a base 16a vertically movable by a lifting device 18 in the form of a well-known uniaxial drive mechanism such as a belt drive mechanism or a ball screw. The entire support arm 7 is vertically movable with the Y-direction moving device 16.

The Y-direction moving device 16 and lifting device 18 constitute the support arm displacing device of this invention.

An operation of the above apparatus will be described hereinafter.

First, the cup 5 is lowered so that the turntable 3 protrudes above the cup 5, and wafer W is carried in and placed on the turntable 3. After the loading of wafer W, the cup 5 is raised to the position surrounding the substrate supporting and spinning mechanism 4 and the wafer W supported thereon.

Next, the lifting device 18 is operated to raise the entire support arm 7, and then the Y-direction moving device 16 moves the entire support arm 7 over the cup 5 from the retracted position to the cleaning position. The lifting device 18 lowers the entire support arm 7 to a predetermined level at which the lower ends of cleaning brushes 8 (8a and 8b) contact, or are slightly spaced from, the surface of wafer W to be cleaned.

The pressing mechanisms 15 (15a and 15b) are operated, as necessary, to exert a pressing force from the cleaning brushes 8 (8a and 8b) to the surface of wafer W.

Figure 5A:
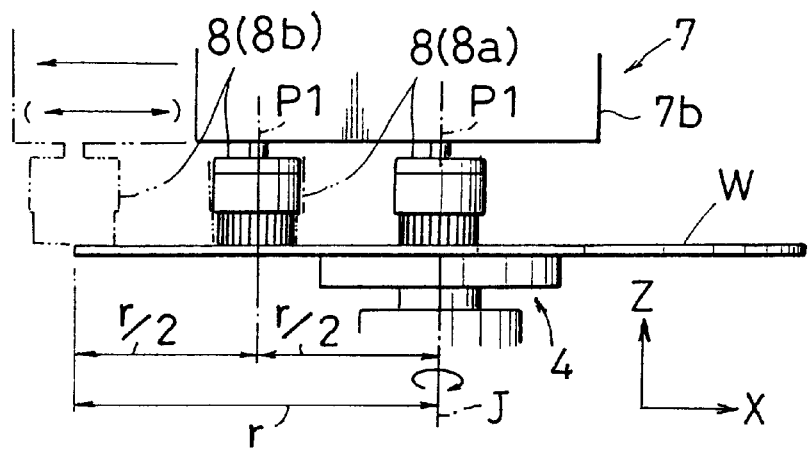
FIG. 5A is a front view of a principal portion illustrating operation of the apparatus in the first embodiment.
Figure 5B:
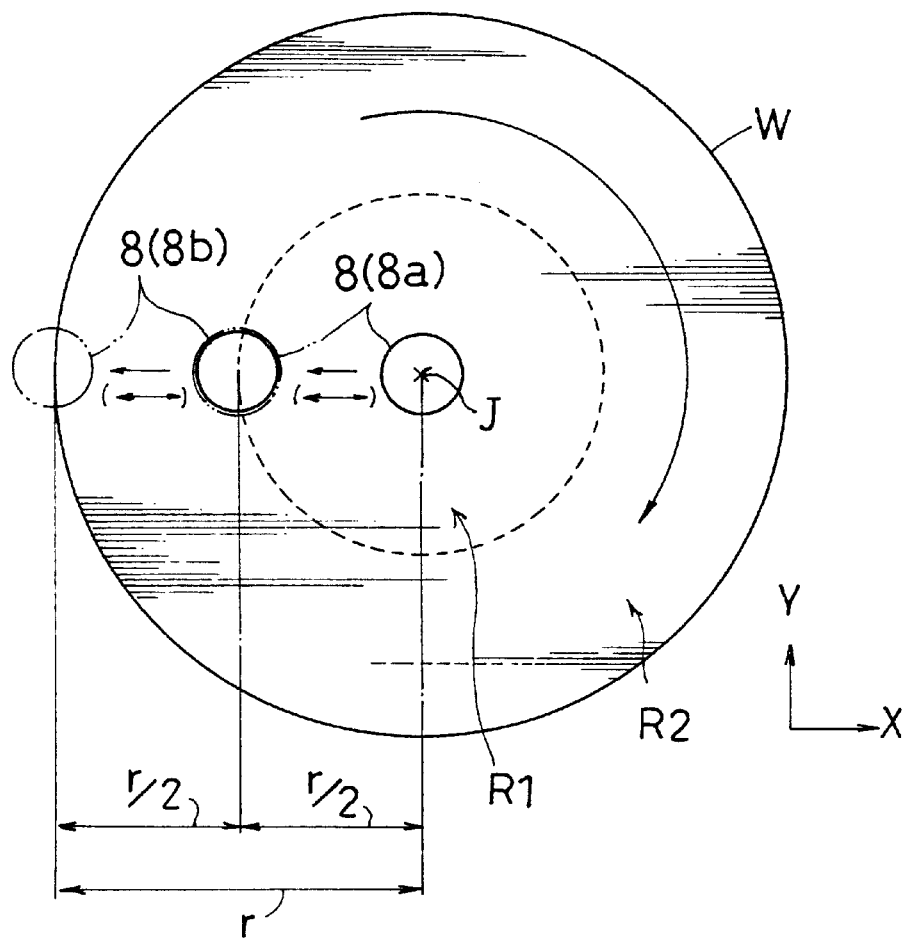
FIG. 5B is a plan view of the principal portion illustrating operation of the apparatus in the first embodiment.

In this state, as shown in solid lines in FIGS. 5A and 5B, the first cleaning brush 8a is positioned at the spin center J of wafer W, while the second cleaning brush 8b is positioned on a circle with a radius r/2 from the spin center J, where wafer W has a radius r.

Wafer W is spun about axis J, and a cleaning liquid is supplied from the nozzles 6 to the surface of wafer W. The surface of wafer W is cleaned by the cleaning brushes 8 (8a and 8b) simultaneously moved by the sliding device 9 radially (in the direction of X) over the surface of wafer W while rotating the respective cleaning brushes 8 (8a and 8b) about axes P1 as necessary.

Each cleaning brush 8 (8a or 8b) is moved the distance of r/2 in the X direction from the cleaning starting position (or reciprocated through that distance as necessary). As a result, the entire surface of wafer W is cleaned by the first and second cleaning brushes 8a and 8b as shown in two-dot-and-dash lines in FIGS. 5A and 5B. Specifically, the first cleaning brush 8a cleans a first region R1 on the surface of wafer W within the circle, shown in a dotted line, with the radius r/2 from the spin center J. The second cleaning brush 8b takes its share of cleaning a second, ring-shaped outer region R2. With a conventional apparatus, the entire surface of wafer W is cleaned by one cleaning brush moved (or reciprocated as necessary) over a range from the spin center J to the outer periphery of wafer W (i.e. a distance corresponding to radius r). In the above embodiment, each cleaning brush 8 is moved over a half of the range in the X direction, to shorten the cleaning time accordingly. The cleaning time may be shortened for a large wafer W also.

Whether to rotate the cleaning brushes 8 about axes P1 or not is determined by taking into account the type of cleaning brushes 8, the type of film formed on the surface of wafer W, cleaning conditions and so on. This embodiment offers an additional option for cleaning the wafer W by rotating only one of the cleaning brushes 8 about axis P1. For example, a cleaning operation may be performed with the first cleaning brush 8a held against rotation about axis P1, and only the second cleaning brush 8b rotated about axis P1. Then, the first region R1 adjacent the spin center J of wafer W, which is vulnerable to damage, may be cleaned with little chance of damage by the first cleaning brush 8a not in rotation, while the second region R2 adjacent the periphery, which tends to be cleaned only insufficiently, may be cleaned sufficiently by the second cleaning brush 8b in rotation.

Further, a cleaning operation may be performed with the first cleaning brush 8a applying a relatively weak pressing force to the surface of wafer W, and the second cleaning brush 8b applying a relatively strong pressing force thereto. Then, the first region R1 may be cleaned by the first cleaning brush 8a with the weak pressing force to reduce the chance of damage, and the second region R2 cleaned sufficiently by the second cleaning brush 8b with the strong pressing force. Such a cleaning performance may be realized far more efficiently than with the conventional apparatus.

Moreover, the first cleaning brush 8a may be a soft cleaning brush such as a mohair brush, and the second cleaning brush 8b a hard cleaning brush such as a PVA brush. Then, the first region R1 may be cleaned by the soft, first cleaning brush 8a with a reduce chance of damage, and the second region R2 cleaned sufficiently by the hard, second cleaning brush 8b. Such a cleaning performance may also be realized far more efficiently than with the conventional apparatus.

The above embodiment may be modified as set out hereunder. The following modifications are applicable also to the other embodiments described hereinafter.

In the above embodiment, the support arm 7 has the two cleaning brushes 8 (cleaning devices) attached thereto. Instead, three or more cleaning brushes may be provided to share the task of cleaning the surface of wafer W which is divided into three or more regions, thereby further shortening the cleaning time. Where, for example, three cleaning brushes 8 are attached to the support arm 7, the first cleaning brush 8 may apply a relatively weak pressing force in cleaning a region adjacent the spin center J of wafer W, the third cleaning brush 8 may apply a relatively strong pressing force in cleaning a region adjacent the periphery of wafer W, and the second cleaning brush 8 may apply a mean pressing force in cleaning an intermediate region. In another example, the first cleaning brush 8 may be a soft cleaning brush, the second cleaning brush 8 a cleaning brush of mean hardness, and the third cleaning brush 8 a hard cleaning brush. In this way, suitable cleaning brushes may be combined to vary cleaning conditions according to different cleaning regions, to realize an elaborately defined cleaning treatment.

In the above embodiment, the distal block 7b is slidable in the X direction to move the cleaning brushes 8 simultaneously and radially over the surface of wafer W to be cleaned. As shown in FIG. 6, the sliding device 9 may be mounted in the distal block 7b to move the cleaning brushes 8 (cleaning devices) per se simultaneously in the X direction relative to the support arm 7 (or the distal block 7b).

Figure 7A:
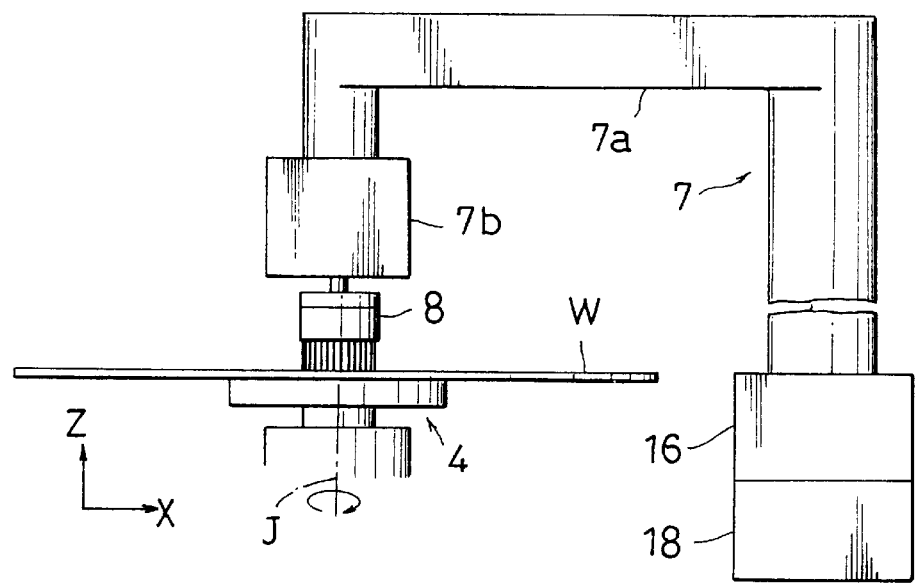
FIG. 7A is a front view of another modified principal portion of the apparatus in the first embodiment.
Figure 7B:
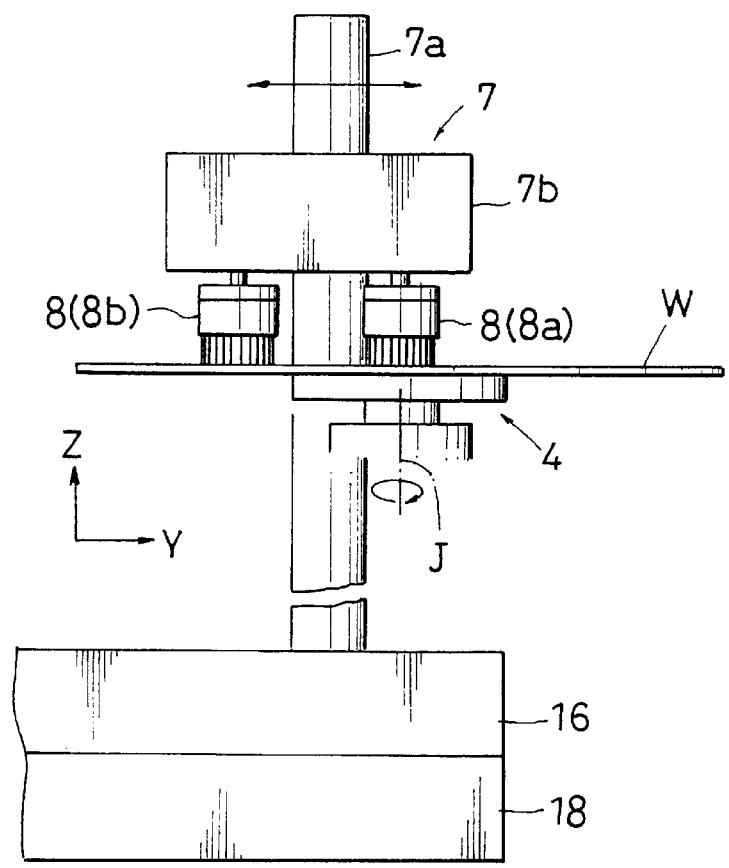
FIG. 7B is a side view of the modification shown in FIG. 7A.

As shown in FIGS. 7A and 7B, the distal block 7b may be elongated in the Y direction and have a plurality (two in the drawings) of cleaning brushes 8 (cleaning devices) arranged in the Y direction. Then, the Y-direction moving device 16 may effect also the operation to move the cleaning brushes 8 simultaneously and radially (in the Y direction) over the surface of wafer W, thereby to dispense with the sliding device 9. This simplifies the drive arrangement of the apparatus.

Figure 8A:
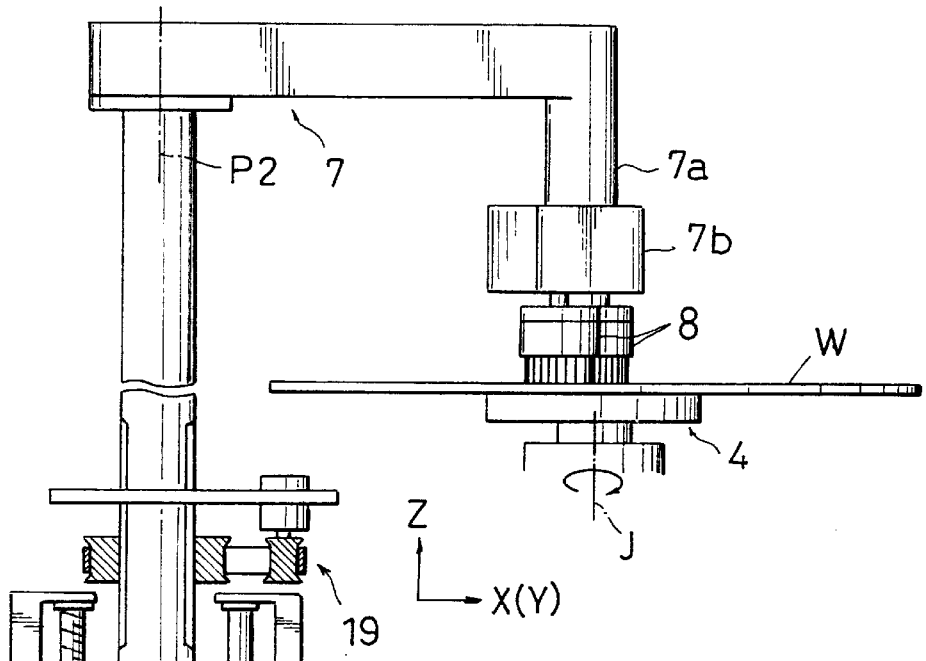
FIG. 8A is a front view of a further modified principal portion of the apparatus in the first embodiment.
Figure 8B:
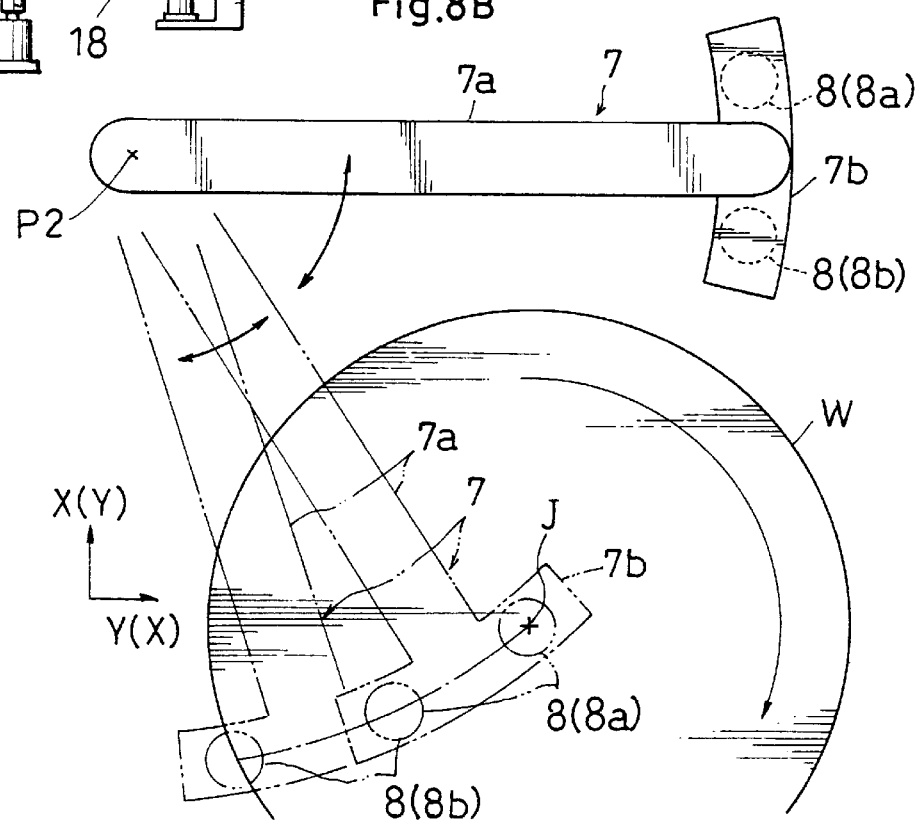
FIG. 8B is a side view of the modification shown in FIG. 8A.

As shown in FIGS. 8A and 8B, the distal block 7b may have an arcuate configuration in plan view, with a plurality (two in the drawings) of cleaning brushes 8 (cleaning devices) arranged along the arc. The support arm 7 (or proximal block 7a) may be adapted rotatable about a vertical axis P2 by a rotating device 19. Then, a rotation of the support arm 7 about the axis P2 effects both the operation for simultaneously moving the cleaning brushes 8 between the cleaning position and retracted position and the operation for simultaneously moving the cleaning brushes 8 (arcuately) over the surface of wafer W. Thus, the construction shown in FIGS. 8A and 8B realizes a simplified drive arrangement.

Second Embodiment

Figure 9:
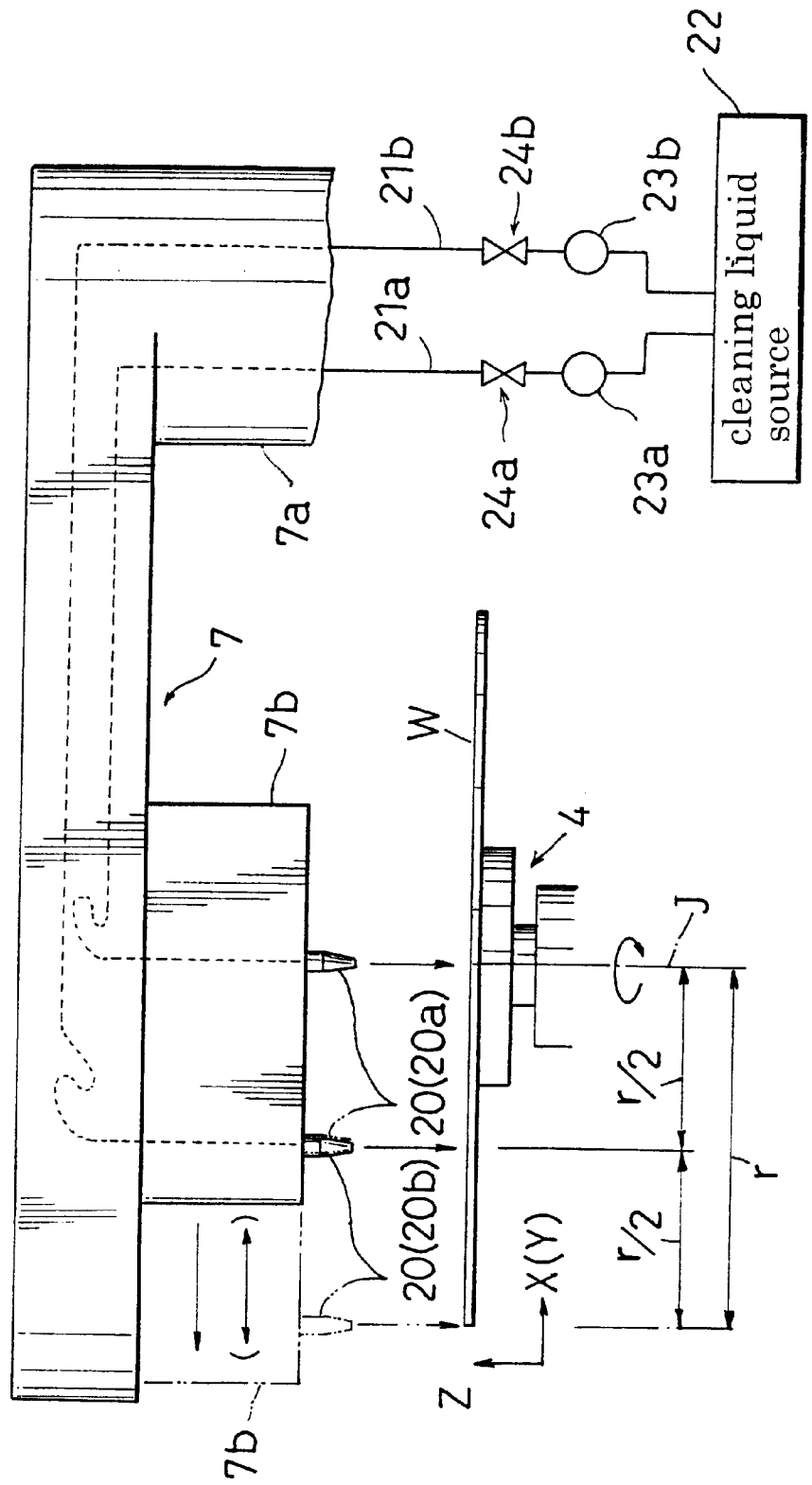
FIG. 9 is a front view of a principal portion of an apparatus in a second embodiment of the present invention.

An apparatus in a second embodiment of the present invention will be described next with reference to FIG. 9.

The apparatus in the second embodiment includes, in place of the cleaning brushes 8 in the first embodiment, a plurality (two in FIG. 9) of high-pressure cleaning nozzles 20 which are another type of cleaning devices, attached to the distal block 7b of the support arm 7. These high-pressure cleaning nozzles 20 (20a and 20b) jet out a cleaning liquid under high pressure to clean a surface of wafer W. The other details of the construction are substantially the same as in the first embodiment, and will not particularly be described.

The high-pressure cleaning nozzles 20a and 20b receive the cleaning liquid from a cleaning liquid source 22 through separate pipings 21a and 21b. The pipings 21a and 21b include pressurizers 23a and 23b such as pumps and switch valves 24a and 24b mounted thereon, respectively, to adjust or control the pressure of the cleaning liquid jets, and supplying and stopping of the cleaning liquid.

In the second embodiment, as in the first embodiment described hereinbefore, the high-pressure cleaning nozzles 20a and 20b in the cleaning position are moved simultaneously and radially through the range of r/2 over the surface of wafer W spinning about axis J. In the course of this movement, the cleaning nozzles 20a and 20b jet out the cleaning liquid under high pressure toward the surface of the wafer W to be cleaned. Thus, the cleaning liquid applied from the high-pressure cleaning nozzles 20a and 20b to the surface of wafer W follows the same tracks as the cleaning brushes 8a and 8b do on the surface of wafer W in the first embodiment. The high-pressure cleaning nozzles 20a and 20b share the task of cleaning the entire surface of wafer W, thereby to shorten the cleaning time.

The same jet pressure may be set for delivering the cleaning liquid from the high-pressure cleaning nozzles 20a and 20b. However, for example, a relatively high jet pressure may be set for delivering the cleaning liquid from the first high-pressure cleaning nozzle 20a which cleans the first region R1 vulnerable to damage, and a relatively high jet pressure for delivering the cleaning liquid from the second high-pressure cleaning nozzle 20b which cleans the second region R2 tending be cleaned only insufficiently. Then, the first region R1 may be cleaned with little chance of damage by the cleaning liquid jetting out under low pressure, while the second region R2 may be cleaned sufficiently by the cleaning liquid jetting out under high pressure.

In place of the high-pressure cleaning nozzles 20a and 20b, a plurality of ultrasonic cleaning nozzles, which are a different type of cleaning devices, may be attached to the support arm 7 (distal block 7b) to share the task of cleaning the entire surface of wafer W. In this case also, the power of the ultrasonic cleaning nozzles may be varied for different regions to be cleaned.

Third Embodiment

Figure 10:
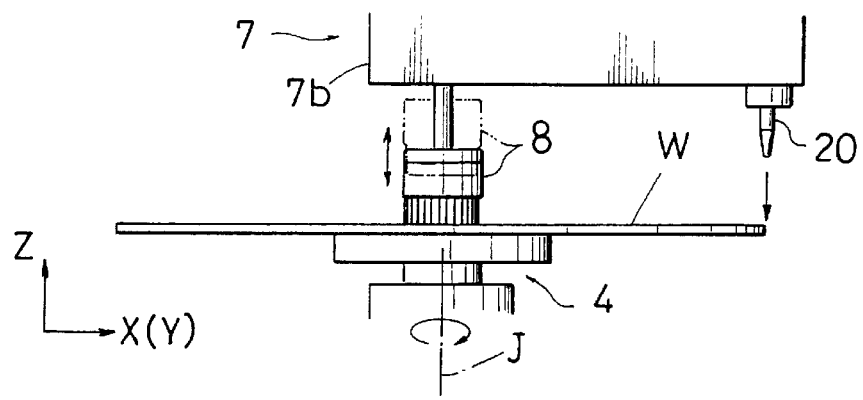
FIG. 10 is a front view of a principal portion of an apparatus in a third embodiment of the present invention.

An apparatus in a third embodiment of the present invention will be described next with reference to FIG. 10.

The apparatus in the third embodiment includes different types of cleaning devices (a cleaning brush 8 and a high-pressure cleaning nozzle 20 being illustrated) attached to the distal block 7b of the support arm 7. The other details of the construction are substantially the same as in the first embodiment, and will not particularly be described.

The cleaning brush 8 is vertically movable relative to the distal block 7b to switch between a cleaning state with the lower end thereof contacting or slightly spaced from the surface of wafer W to be cleaned, and an inoperative position with the lower end thereof moved away from the surface of wafer W. Further, switching between cleaning liquid supply to the high-pressure cleaning nozzle 20 and suspension of the liquid supply may be made as in the second embodiment. Thus, the high-pressure cleaning nozzle 20 is switchable between a cleaning state for jetting out the cleaning liquid and an inoperative state for stopping the cleaning liquid. The switching between the cleaning state and inoperative state of the cleaning brush 8 and high-pressure cleaning nozzle 20 is carried out by a controller, not shown, formed of a microcomputer, for example.

Figure 11A:
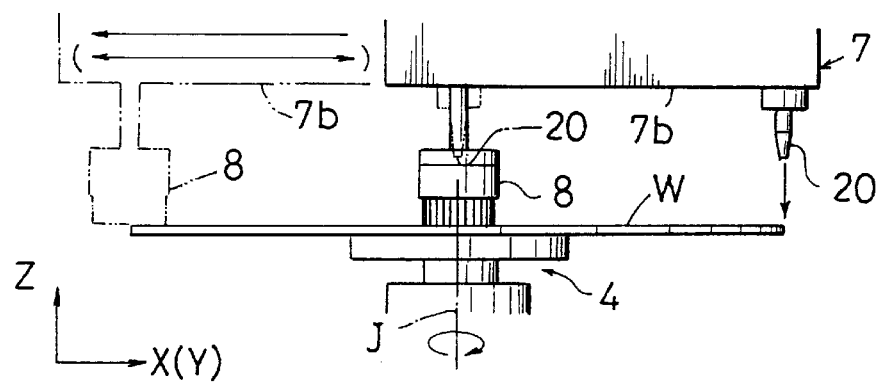
FIG. 11A is a front view of a principal portion illustrating operation of the apparatus in the third embodiment.
Figure 11B:
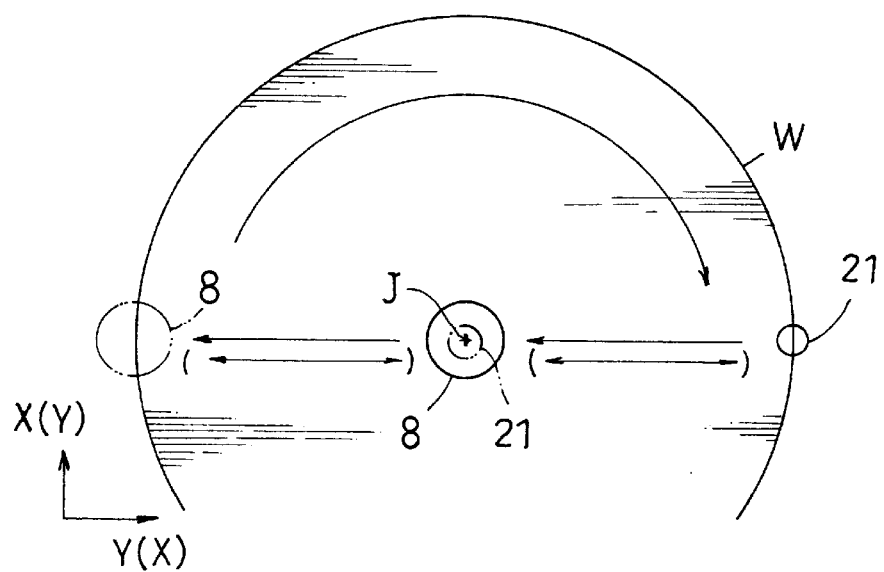
FIG. 11B is a plan view of the principal portion illustrating operation of the apparatus in the third embodiment.

According to the above apparatus in the third embodiment, both cleaning devices 8 and 20 are placed in the cleaning state, and simultaneously moved (or reciprocated as necessary) over the surface of wafer W between a position shown in solid lines and a position shown in two-dot-and-dash lines in FIGS. 11A and 11B. In this way, the entire surface of wafer W may be cleaned simultaneously by the two cleaning devices 8 and 20. Numeral 21 in FIG.

11B denotes a position on the surface of wafer W where the cleaning liquid is applied from the high-pressure cleaning nozzle 20.

Only one of the cleaning devices 8 and 20 may be selected and placed in the cleaning state. Then, the cleaning device in the cleaning state is moved (or reciprocated as necessary) over the surface of wafer W to be cleaned, through a range between spin center J and outer periphery of the wafer W. In this way, the entire surface of wafer W may be cleaned by one type of cleaning device. The cleaning devices may be changed simply by switching the cleaning device in the cleaning state to the inoperative state, and switching the cleaning device in the inoperative state to the cleaning state.

Thus, according to the third embodiment, a cleaning operation may be carried out efficiently with the varied types of cleaning devices, and in a reduced time compared with the conventional apparatus.

A desired combination of different types of cleaning devices may be attached to the support arm 7.

Figure 12:
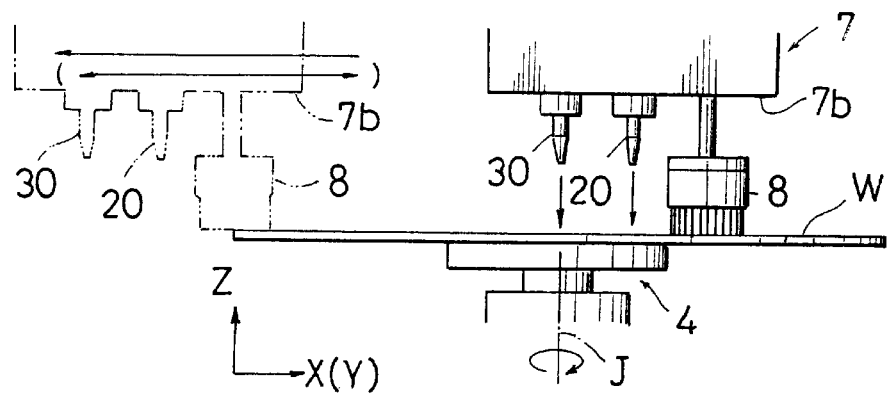
FIG. 12 is a front view of a modified principal portion of the apparatus in the third embodiment.

Three or more types of cleaning devices may be attached to the support arm 7. Where, for example, three type of cleaning devices such as a cleaning brush 8, a high-pressure cleaning nozzle 20 and an ultrasonic cleaning nozzle 30 are attached to the support arm 7, as shown in FIG. 12, the cleaning devices 8, 20 and 30 may be juxtaposed in the direction of movement over the surface of wafer W to be cleaned. In the construction shown in FIG. 12, all cleaning devices 8, 20 and 30 are placed in the cleaning state, and simultaneously moved (or reciprocated as necessary) from a cleaning starting position (shown in solid lines) to a position (shown in two-dot-and-dash lines) in which the cleaning brush 8 having passed the spin center J of wafer W reaches the outer periphery thereof. In this way, the entire surface of wafer W may be cleaned simultaneously by all of the cleaning devices 8, 20 and 30. With this construction, positions of application of the cleaning liquid delivered from the high-pressure cleaning nozzle 20 and ultrasonic cleaning nozzle 30 would successively depart from the surface of wafer W before the cleaning brush 8 reaches the outer periphery of wafer W. This inconvenience may be avoided by successively stopping the cleaning liquid supply as the positions of application of the cleaning liquid from the nozzles 20 and 30 depart from the surface of wafer W. In the case of reciprocation, the cleaning liquid supply may be resumed when the positions of application of the cleaning liquid from the nozzles 20 and 30 are reinstated on the surface of wafer W after the departure therefrom.

Figures 13A, 13B:
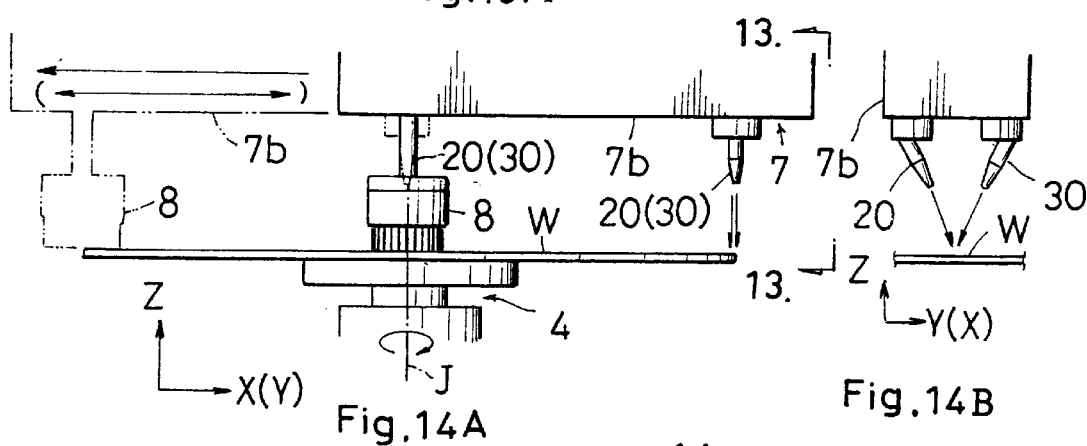
FIG. 13A is a front view of another modified principal portion of the apparatus in the third embodiment.
FIG. 13B is a section taken on line 13—13 of FIG. 13A.

In the construction shown in FIG. 12, the cleaning devices 8, 20 and 30 are arranged to clean different positions of the surface of wafer W. As shown in FIGS. 13A and 13B (FIG. 13B showing a section taken on line 13—13 of FIG. 13A), the high-pressure cleaning nozzle 20 and ultrasonic cleaning nozzle 30 may be adapted to direct the cleaning liquid to the same position of application. The entire surface of wafer W may be cleaned simultaneously by all of the cleaning devices 8, 20 and 30 moved (or reciprocated as necessary) between a position shown in solid lines and a position shown in two-dot-and-dash lines in FIG. 13A.

Figures 14A, 14B:
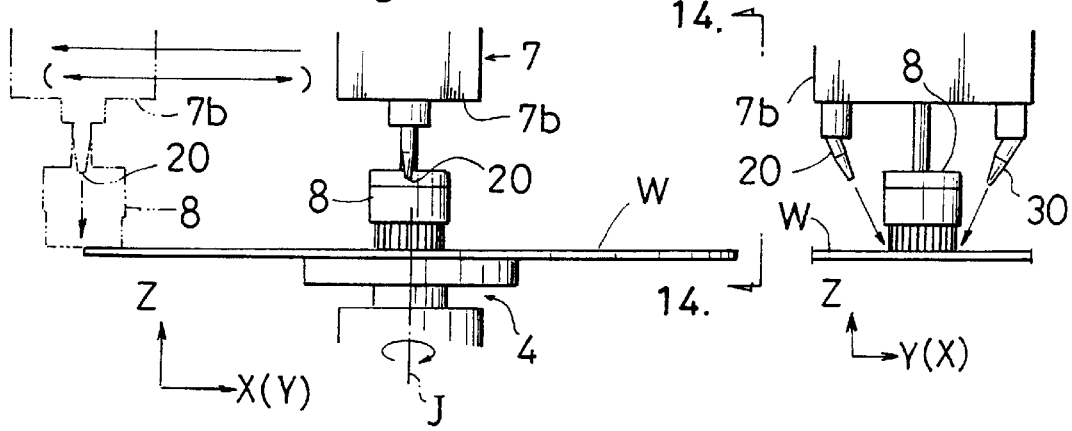
FIG. 14A is a front view of a further modified principal portion of the apparatus in the third embodiment.
FIG. 14B is a section taken on line 14—14 of FIG. 14A.

As shown in FIGS. 14A and 14B (FIG. 14B showing a section taken on line 14—14 of FIG. 14A), all cleaning devices 8, 20 and 30 may be arranged to clean the same position. Then, the entire surface of wafer W may be cleaned simultaneously by all of the cleaning devices 8, 20 and 30 moved (or reciprocated as necessary) between a position shown in solid lines and a position shown in two-dot-and-dash lines in FIG. 14A.

Where desirable, the cleaning brush 8 and high-pressure cleaning nozzle 20, or the cleaning brush 8 and ultrasonic cleaning nozzle 30, may be arranged to clean the same position.

Figure 15:
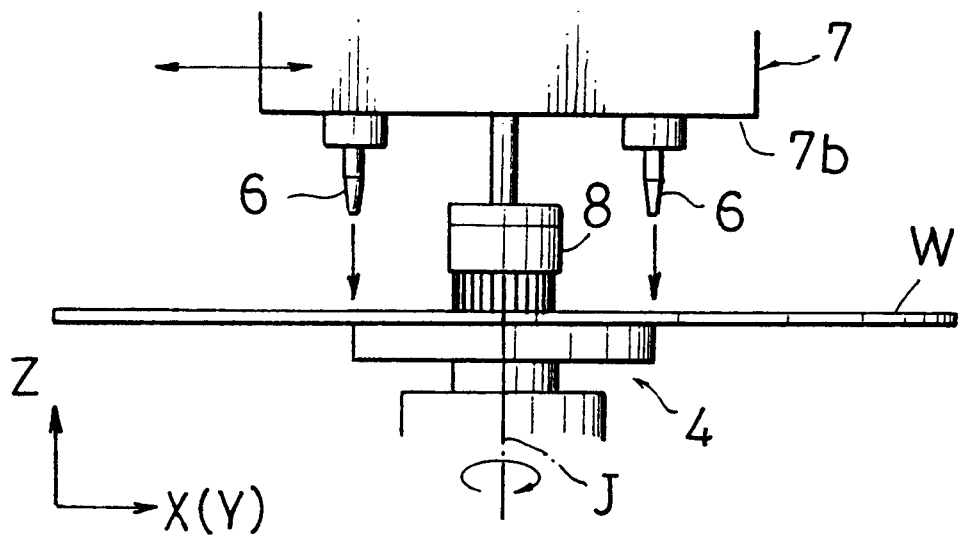
FIG. 15 is a front view of a still further modified principal portion of the apparatus in the third embodiment.
Figure 16:
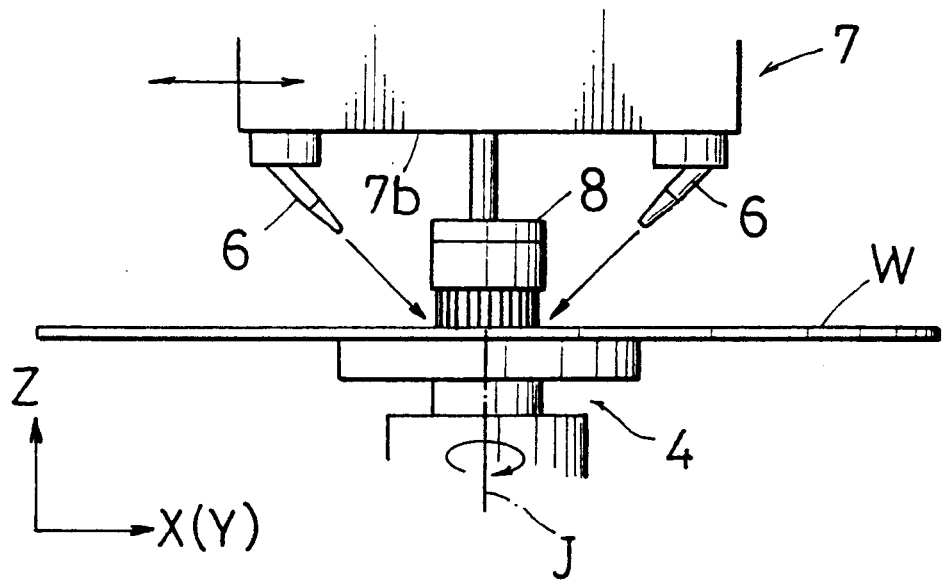
FIG. 16 is a front view of yet another modified principal portion of the apparatus in the third embodiment.

As described in the first embodiment, the nozzles 6 are arranged in fixed positions outside the cup 5 for jetting out the cleaning liquid to the surface of the wafer W cleaned by the cleaning brushes 8. As shown in FIGS. 15 and 16, nozzles 6 may be attached along with a cleaning brush 8 to the support arm 7 (distal block 7b). FIG. 15 shows a construction in which the cleaning brush 8 and nozzles 6 clean different positions. FIG. 16 shows a construction in which the cleaning brush 8 and nozzles 6 clean the same position. Where desirable, a chemical may be delivered through the nozzles 6.

Fourth Embodiment

Figure 17:
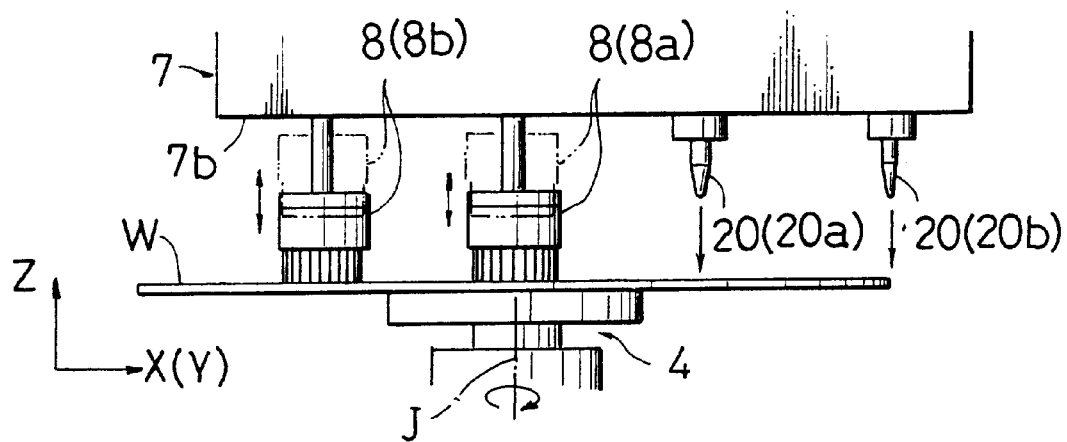
FIG. 17 is a front view of a principal portion of an apparatus in a fourth embodiment of the present invention.

An apparatus in a fourth embodiment of the present invention will be described next with reference to FIG. 17.

The apparatus in the fourth embodiment includes a plurality (two in FIG. 17) of each different type cleaning devices (cleaning brushes 8 and high-pressure cleaning nozzles 20 being illustrated) attached to the distal block 7b of the support arm 7. The other details of the construction are substantially the same as in the first to third embodiments, and will not particularly be described.

Figure 18:
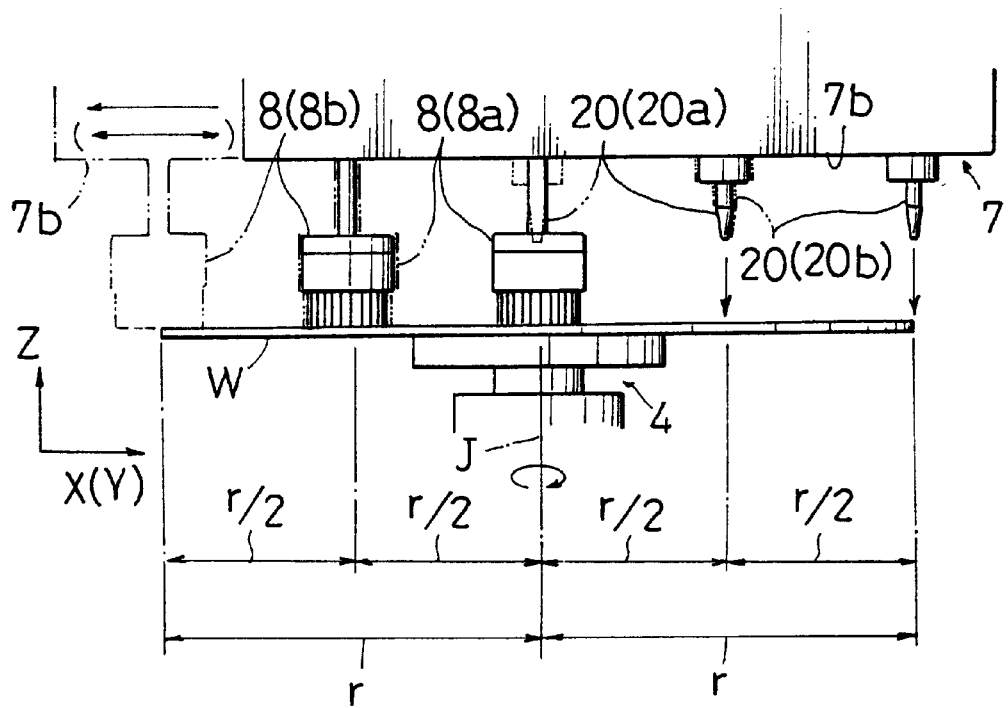
FIG. 18 is a front view of a principal portion illustrating operation of the apparatus in the fourth embodiment.

With this construction, the cleaning devices 8 and 20 are placed in the cleaning state, and simultaneously moved (or reciprocated as necessary) over the surface of wafer W between a position shown in solid lines and a position shown in two-dot-and-dash lines in FIG. 18. In this way, as in the third embodiment, the entire surface of wafer W may be cleaned efficiently with the varied types of cleaning devices 8 and 20, and in a reduced time compared with the conventional apparatus. As in the first and second embodiments, the same type of cleaning devices may share the task of cleaning, thereby to reduce the cleaning time still further.

In the fourth embodiment also, of course, desired cleaning devices may be selected, and only these cleaning devices may be set to the cleaning state.

In the fourth embodiment also, three or more types of cleaning devices may be attached to the support arm 7.

The foregoing embodiments and modifications have been described, exemplifying cleaning of the upper surface of wafer W. The present invention is applicable also to cleaning of a lower surface (usually the back surface) of wafer W.

The present invention may be embodied in other specific forms without departing from the spirit or essential attributes thereof and, accordingly, reference should be made to the appended claims, rather than to the foregoing specification, as indicating the scope of the invention.

What is claimed is:

1. An apparatus for cleaning a surface of a substrate, comprising:

substrate support means for supporting said substrate;

substrate spin means for spinning said substrate supported by said substrate support means;

cleaning means including a plurality of cleaning brushes for simultaneously cleaning said surface of said substrate, said cleaning brushes having pressing mechanisms, respectively;

a support arm for supporting said cleaning means including said cleaning brushes;

support arm displacing means for displacing said support arm to move simultaneously said cleaning brushes supported by said support arm between a cleaning position and a retracted position; and cleaning displacement means for simultaneously moving said cleaning brushes supported by said support arm, over said surface of said substrate supported by said substrate support means and spun by said substrate spin means;

wherein said cleaning brushes are operable with separate pressing forces set according to regions to be cleaned by said cleaning brushes.

2. An apparatus as defined in claim 1, wherein an operation by said cleaning displacement means for simultaneously moving said plurality of cleaning brushes supported by said support arm, over said surface of said substrate supported by said substrate support means and spun by said substrate spin means, is effected by a displacement of said support arm by said support arm displacing means.

3. An apparatus for cleaning a surface of a substrate, comprising:

substrate support means for supporting said substrate;

substrate spin means for spinning said substrate supported by said substrate support means;

cleaning means including a plurality of high-pressure cleaning nozzles for simultaneously cleaning said surface of said substrate, said cleaning nozzles jetting out a cleaning liquid under adjustable pressure, respectively;

a support arm for supporting said cleaning means including said high-pressure cleaning nozzles;

support arm displacing means for displacing said support arm to move simultaneously said high-pressure cleaning nozzles supported by said support arm between a cleaning position and a retracted position; and cleaning displacement means for simultaneously moving said high-pressure cleaning nozzles supported by said support arm, over said surface of said substrate supported by said substrate support means and spun by said substrate support means for supporting said spin means;

wherein said high-pressure cleaning nozzles are operable to jet out the cleaning liquid under a pressure separately set according to regions to be cleaned by said high-pressure cleaning nozzles.

4. An apparatus as defined in claim 3, wherein an operation by said cleaning displacement means for simultaneously moving said plurality of high-pressure cleaning nozzles supported by said support arm, over said surface of said substrate supported by said substrate support means and spun by said substrate spin means, is effected by a displacement of said support arm by said support arm displacing means.

5. An apparatus for cleaning a surface of a substrate, comprising:

substrate support means for supporting said substrate;

substrate spin means for spinning said substrate supported by said substrate support means;

cleaning means including a plurality of ultrasonic cleaning nozzles for simultaneously cleaning said surface of said substrate, said cleaning nozzles having ultrasonic power set separately;

a support arm for supporting said cleaning means including said ultrasonic cleaning nozzles;

support arm displacing means for displacing said support arm to move simultaneously said ultrasonic cleaning nozzles supported by said support arm between a cleaning position and a retracted position; and cleaning displacement means for simultaneously moving said ultrasonic cleaning nozzles supported by said support arm, over said surface of said substrate supported by said substrate support means and spun by said substrate spin means;

wherein said ultrasonic cleaning nozzles are operable with separate ultrasonic power set according to regions to be cleaned by said ultrasonic cleaning nozzles.

6. An apparatus as defined in claim 5, wherein an operation by said cleaning displacement means for simultaneously moving said plurality of ultrasonic cleaning nozzles supported by said support arm, over said surface of said substrate supported by said substrate support means and spun by said substrate spin means, is effected by a displacement of said support arm by said support arm displacing means.

7. An apparatus for cleaning a surface of a substrate, comprising:

substrate support means for supporting said substrate;

substrate spin means for spinning said substrate supported by said substrate support means;

cleaning means including a plurality of dissimilar cleaning members for simultaneously cleaning said surface of said substrate;

a support arm for supporting said cleaning means including said cleaning members;

support arm displacing means for displacing said support arm to move simultaneously said cleaning members supported by said support arm between a cleaning position and a retracted position; and cleaning displacement means for simultaneously moving said cleaning members supported by said support arm, over said surface of said substrate supported by said substrate support means and spun by said substrate spin means;

wherein said cleaning members are switchable, separately by type, between a cleaning state and an inoperative state.

8. An apparatus as defined in claim 7, wherein an operation by said cleaning displacement means for simultaneously moving said plurality of cleaning members supported by said support arm, over said surface of said substrate supported by said substrate support means and spun by said substrate spin means, is effected by a displacement of said support arm by said support arm displacing means.

* * * * *